United States Patent
Peck

(10) Patent No.: US 10,453,714 B2
(45) Date of Patent: Oct. 22, 2019

(54) THERMAL PROCESS DEVICE

(71) Applicant: SANDVIK THERMAL PROCESS INC, Sonora, CA (US)

(72) Inventor: Kevin Peck, Sonora, CA (US)

(73) Assignee: SANDVIK THERMAL PROCESS, INC., Sonora, CA (US)

( * ) Notice: Subject to any disclaimer, the term of this patent is extended or adjusted under 35 U.S.C. 154(b) by 55 days.

(21) Appl. No.: 15/669,901

(22) Filed: Aug. 5, 2017

(65) Prior Publication Data

US 2018/0130680 A1 May 10, 2018

Related U.S. Application Data

(60) Provisional application No. 62/371,369, filed on Aug. 5, 2016.

(51) Int. Cl.
*H01L 21/67* (2006.01)
*F27D 9/00* (2006.01)
(Continued)

(52) U.S. Cl.
CPC ...... *H01L 21/67109* (2013.01); *C21D 9/0062* (2013.01); *F27B 9/30* (2013.01);
(Continued)

(58) Field of Classification Search
CPC ...... C21D 9/0062; C21D 9/0056; C21D 9/00; H01L 21/67754; F27D 2009/0075;
(Continued)

(56) References Cited

U.S. PATENT DOCUMENTS 4,266,931 A * 5/1981 Struckmann ............... F23B 1/32
110/246
4,340,359 A * 7/1982 Struckmann ............... F23B 1/32
432/14
(Continued)

FOREIGN PATENT DOCUMENTS

EP 2361994 A1 8/2011
WO 2010068703 A1 6/2010

*Primary Examiner* — Steven S Anderson, II
(74) *Attorney, Agent, or Firm* — Corinne R. Gorski

(57) ABSTRACT

A thermal process device for heat treating a product or plurality of products includes a thermal processing chamber having opposed distal ends and a plurality of controllable heating zones. At least one buffer zone is disposed at each of the distal ends. The buffer zones and heating zones of the thermal processing chamber form a heating element assembly. The heating assembly has an inner and outer surface and a secondary shell is disposed about the outer surface of the heating element assembly and spaced therefrom to form an inlet flow passage for a flow of a temperature adjusting medium along the heating element assembly. A flow directing arrangement is configured to direct the flow of the temperature adjusting medium in the inlet flow passage to the different zones of the heating assembly to adjust the temperature in the heating zones, wherein a majority of the flow of the temperature adjusting medium is delivered to a central zone of the heating temperature assembly and then outward toward at least one of the distal ends.

22 Claims, 24 Drawing Sheets

(51) Int. Cl.
*F27B 9/30* (2006.01)
*C21D 9/00* (2006.01)
*H01L 21/677* (2006.01)

(52) U.S. Cl.
CPC .............. *F27B 9/3011* (2013.01); *F27D 9/00* (2013.01); *H01L 21/67248* (2013.01); *H01L 21/67754* (2013.01); *C21D 9/0056* (2013.01); *F27D 2009/0075* (2013.01)

(58) Field of Classification Search
CPC ..... F27D 2009/0005; F27D 2009/0008; F27D 2009/0078; F27D 1/12; F27B 9/30; F27B 9/3011; F27B 17/0025; F23J 13/025
See application file for complete search history.

(56) References Cited

U.S. PATENT DOCUMENTS

| | | | |
|---|---|---|---|
| 4,802,441 A | 2/1989 | Waugh | |
| 5,097,890 A | 3/1992 | Nakao | |
| 5,230,617 A * | 7/1993 | Klein | F27D 9/00 110/180 |
| 9,290,823 B2 | 3/2016 | Zurecki et al. | |
| 2004/0234920 A1* | 11/2004 | Peck | F27B 17/0025 432/233 |
| 2005/0115945 A1 | 6/2005 | Kesteren et al. | |
| 2012/0223066 A1 | 9/2012 | Yoshii et al. | |
| 2013/0095444 A1* | 4/2013 | Christensen | F23J 13/025 432/249 |
| 2014/0017140 A1* | 1/2014 | Suda | C10K 1/26 422/187 |

* cited by examiner

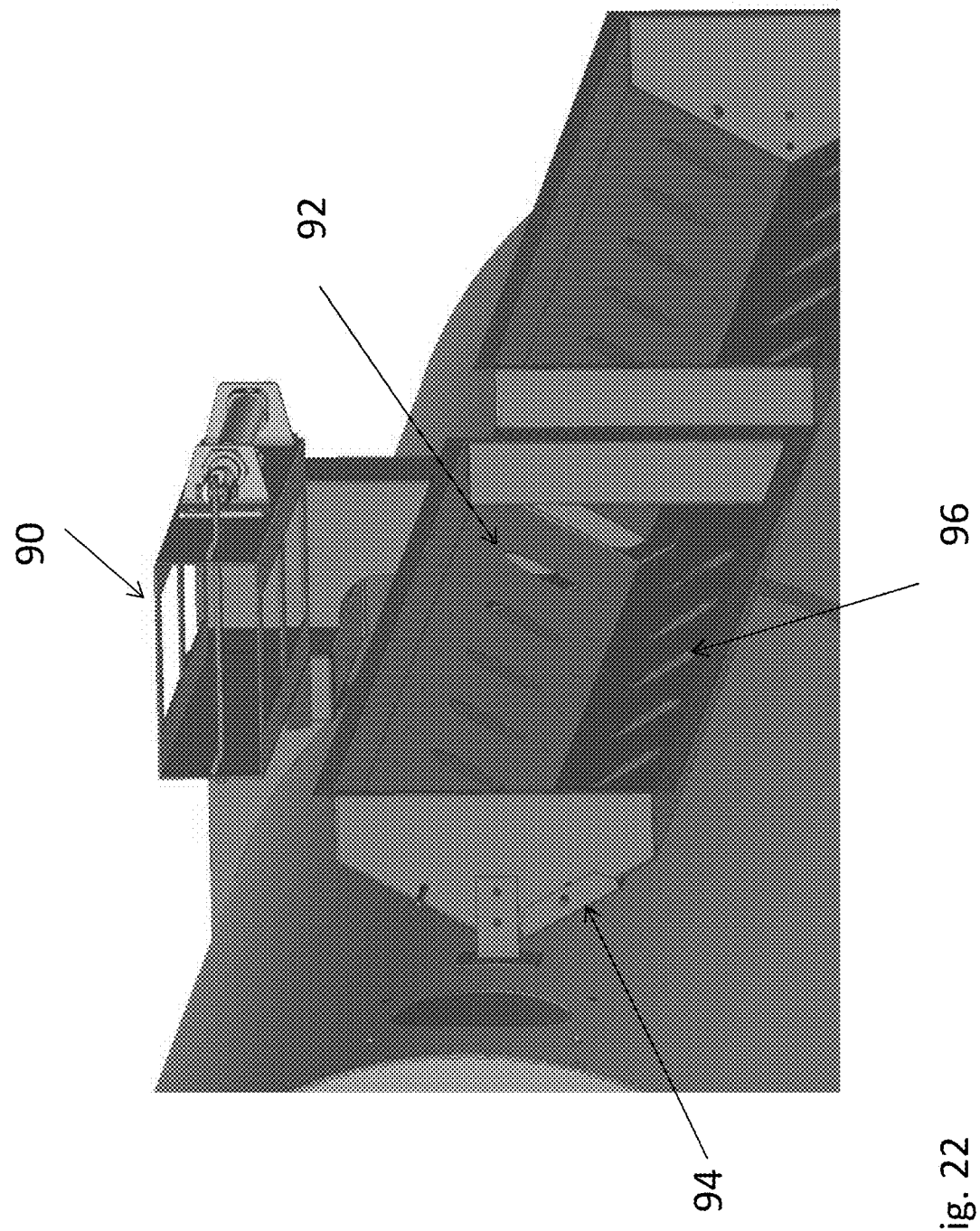

THERMAL PROCESS DEVICE

RELATED APPLICATION DATA

This application claims priority of U.S. Provisional Application No. 62/371,369, filed Aug. 5, 2016, which the entirety thereof is incorporated herein by reference.

TECHNICAL FIELD

The present disclosure relates to a thermal process device for heat treating a product or plurality of products with improved temperature control.

BACKGROUND

Many products may undergo heat treatment in furnaces for different reasons. For example, in semiconductor wafer fabrication the semiconductor wafers undergo thermal curing, and in steel manufacturing the steel undergoes an annealing process for hardening the steel. Often in semiconductor production the temperature must be controlled very precisely as minor variations in the temperature can affect yields, the temperature may need to be controlled for a specific amount of time and often the temperature needs to be stabilized quickly so that the next step of manufacturing process may begin. Therefore it is imperative that heat treatment can be precisely controlled.

Active fluidic cooling is a well-known method to reduce the cycle time in batch processing furnaces. In this case products will reside within the thermal process chamber and a temperature adjusting medium is forced through the passageways in contact with furnace to adjust the temperature of the thermal process device. Existing systems include a uni-directional flow method, whereby the temperature adjusting medium is injected at one distal end and is exhausted at the other distal end of the thermal process chamber, with this system the distal end where the temperature adjusting medium is injected will cool faster than at the exhaust end due to the transfer of energy, this results in a large sloping temperature gradient across the load which takes substantial time to equalize at the end of the process cycle.

Some improvements have been made by introducing a bi-directional flow, whereby the temperature adjusting medium is introduced alternatingly at both distal ends. In this case the cooling between the two distal ends is more uniform and balanced, however the central mass cools more slowly as some heat capacity is lost as it travels towards the center.

For the batch processing of silicon substrates in a thermal process chamber, new generations of thermal process chambers are being required to support both larger batch sizes and larger size substrates, both resulting in higher masses of material being processed, therefore as the product is treated at high temperatures, e.g. 600-1200° C., more energy is stored in the mass. Therefore with existing cooling systems the cycle time is increased which consequently results in decreased processing capacity.

Accordingly, there is a need to increase the cooling capacity of the thermal processing systems as well as an advantage gained by improving the thermal uniformity during cooling.

SUMMARY

One aspect of the present disclosure is to solve or at least reduce the above mentioned problems and drawbacks. The present disclosure therefore provides a thermal process device for heat treating a product or plurality of products, the assembly including a thermal processing chamber having opposed distal ends and a plurality of controllable heating zones; at least one buffer zone disposed at each of the distal ends, the buffer zones and heating zones of the thermal processing chamber forming a heating element assembly, the heating assembly having an inner and outer surface; a secondary shell disposed about the outer surface of the heating element assembly spaced to form a flow passage for a flow of a temperature adjusting medium along the heating element assembly; and a flow directing arrangement configured to direct the flow of the temperature adjusting medium in the inlet flow passage to the different zones of the heating assembly to adjust the temperature in the heating zones, wherein a majority of the flow of the temperature adjusting medium is delivered to a central zone of the heating temperature assembly and then outward toward at least one of the distal ends.

The foregoing summary, as well as the following detailed description of the embodiments, will be better understood when read in conjunction with the appended drawings. It should be understood that the embodiments depicted are not limited to the precise arrangements and instrumentalities shown.

BRIEF DESCRIPTION OF THE DRAWINGS

FIG. 22 is a partial perspective view of the flow coupler dampers.

DETAILED DESCRIPTION

Figure 1:
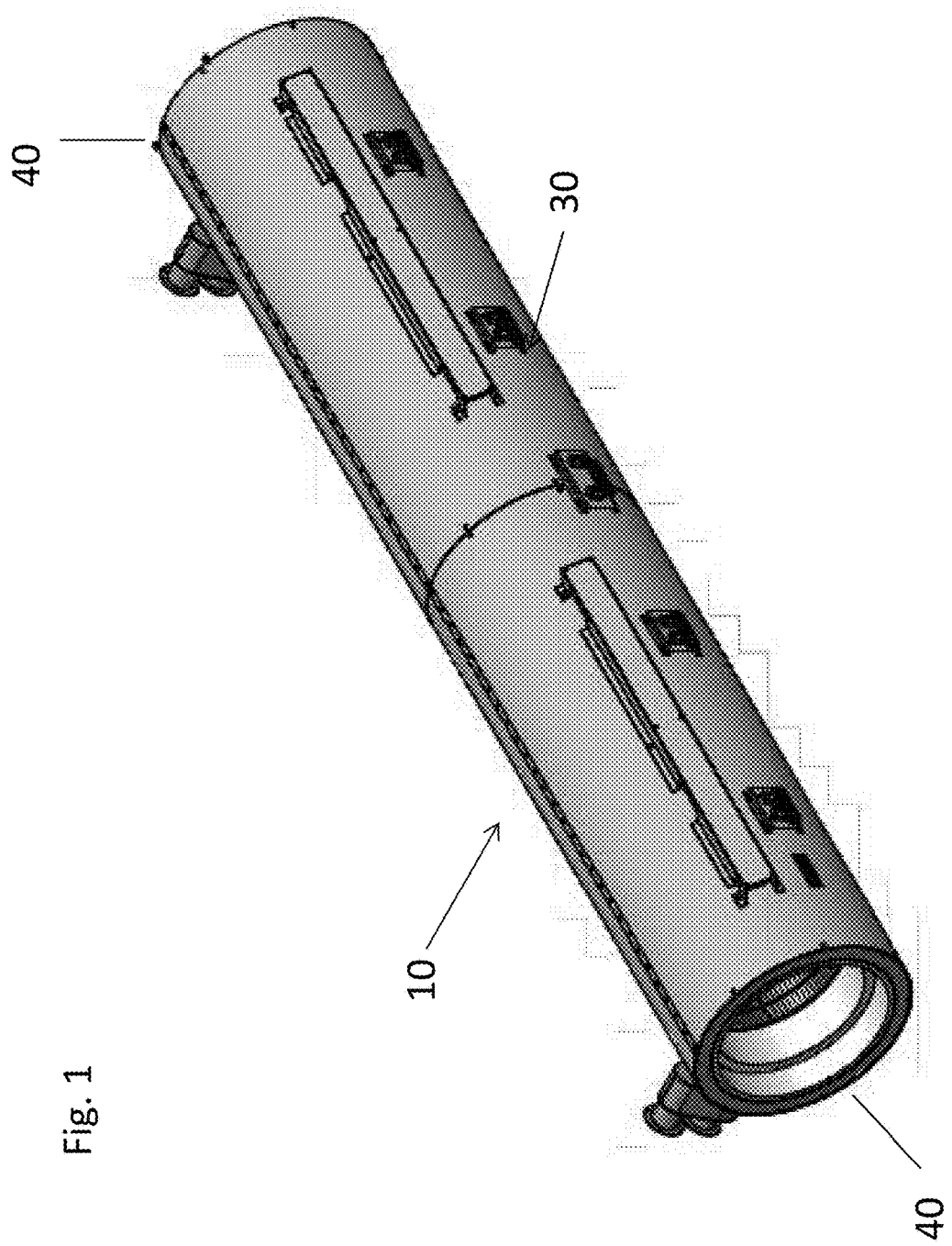
FIG. 1 is a perspective view of the thermal process device according to the present disclosure.
Figure 2:
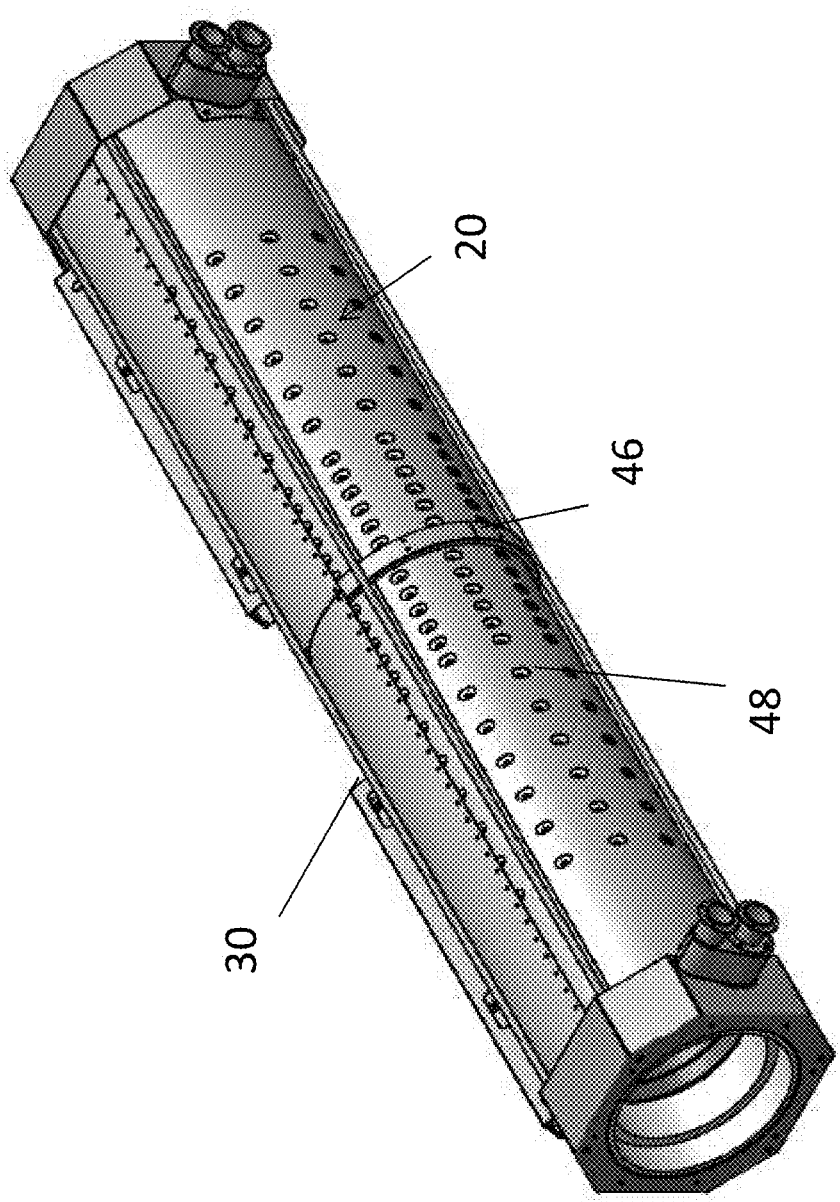
FIG. 2 is a perspective view of the thermal process device of FIG. 1 with the outer shell partially removed.
Figure 3:
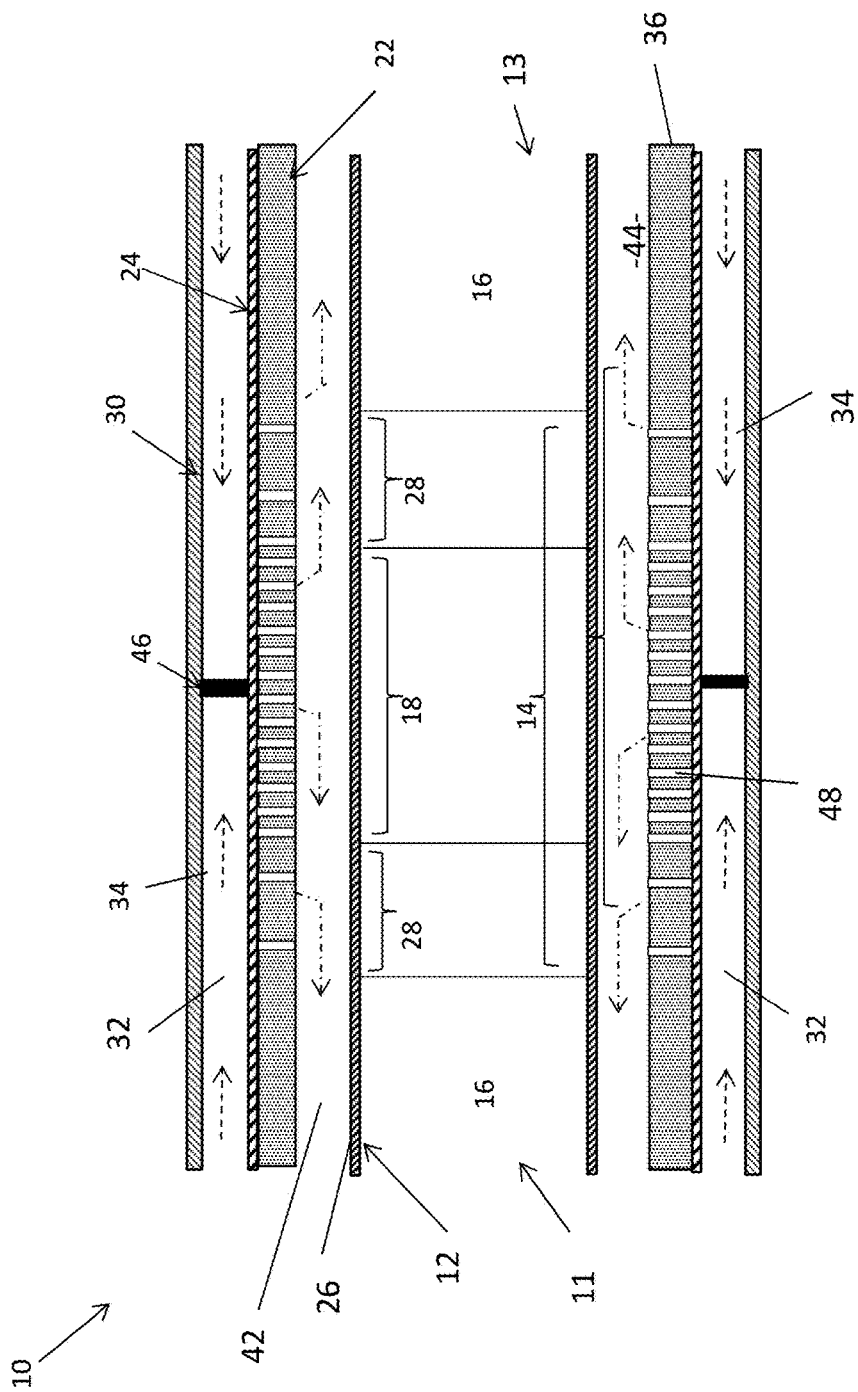
FIG. 3 is a partial cross-sectional view of the thermal process device of FIG. 1.

Referring to FIGS. 1-3, a thermal process device 10 for heat treating a product or plurality of products includes a thermal processing chamber 12 (FIG. 3) having a plurality of controllable heating zones 14 (FIG. 3). The products to be treated may include semiconductor wafers, for example, for curing or doping or in the annealing of steel.

As shown in FIG. 3, at least one buffer zone 16 is disposed at each of the distal ends 11, 13. The buffer zones 16 and heating zones 14 of thermal processing chamber 12 form a heating element assembly 20. The heating assembly 20 has an inner 22 and outer surface 24.

A secondary shell 30 is disposed about the outer surface 24 of the heating element assembly 20 and is spaced therefrom to form an inlet flow passage 32 for a flow of a temperature adjusting medium 34 along the heating element assembly 20. Secondary shell 30 can be made from aluminium or stainless steel. However, it should be appreciated that other materials can be used for shell 30, as well as the heating element assembly. The temperature adjusting medium 34 can be air or other gas as applicable to the process being performed. Thermal processing chamber 12 and heating element assembly 20 can be substantially cylindrical.

As will be described further herein, flow passage 32 includes an arrangement for directing the flow of the temperature adjusting medium in the flow passage to the different zones of the heating assembly to adjust the temperature in the heating zones 14. This enables improved thermal uniformity during cooling as the temperature adjusting medium is delivered to the correct regions in the correct amounts in proportion to the cooling requirements, therefore reducing the recovery time after the thermal processing is completed and thereby increasing the throughput of the device.

As shown in FIG. 1, the thermal process device includes a plurality of vestibule assemblies 40, one disposed at each distal end, wherein the vestibule assemblies 40 form part of the heating element assembly. As will be described further herein, each vestibule assembly 40 is in fluidly communication with flow passage 32.

As discussed above, the direction of the inlet flow of the temperature adjusting medium in passage 32 can be controlled. As shown in FIGS. 2 and 3, a flow directing arrangement includes at least one barrier 46 is disposed in the flow passage 32 to divide the flow into at least two different directions to control the flow to desired heating zones 14 of the heating element assembly. The barrier can be made of metal or thermal insulation or a combination thereof and typically divides the flow passage into equal portions.

As discussed supra, flow passage 32 between the outer surface 24 of the heating element assembly 20 and the secondary shell 30 forms an inlet flow passage. Referring again to FIG. 3, an annular space 42 exists between the inner surface 22 of the heating element assembly 20 and an outer surface 26 of the process chamber 12. Annular space 42 forms an exhaust flow passage 44 for the flow of the temperature adjusting medium 34 as it passes from inlet flow passage 32.

As shown in FIG. 3, at least one layer of insulating material 36 is disposed at the inner surface 22 of the heating element assembly in annular space 42. The at least one layer of insulating material 36 forms an innermost surface of the heating element assembly. In addition to barrier(s) 46, the arrangement for directing the flow of temperature adjusting medium 34 includes a plurality of injection ports 48 disposed in the at least one layer of the insulating material 36.

As described above, as temperature adjusting medium 34 flows from vestibule assemblies 40 though inlet flow passage 32 it is separated or divided into two or more inlet flow plenums when it encounters barrier(s) 46. Having the inlet flow paths divided into two or more flow plenums increases the temperature adjusting medium flow capacity and therefore yields higher cooling rates. The two or more flow plenums can be individually pressurized and therefore the flow can be adjusted separately for the different areas of the chamber. The flow of the temperature adjusting medium can be proportioned appropriately to the cooling requirements of the different areas of the chamber by adjusting the vacuum applied at each end vestibule.

Temperature adjusting medium 34 will then pass through injection ports 48 into exhaust flow passage 44. As described further below, the coolest temperature adjusting medium is introduced at the center of the thermal process device where it is most needed, yielding a much more uniform cooling rate across the product mass that is being thermally processed. Thus, in order to improve efficiency, a majority of the temperature adjusting medium can be delivered to a central portion 18 of the assembly, thereby increasing the cooling fluid capacity therein. The temperature adjusting medium will flow to the heating zones in the central zone and then outwards to at least one end or in two different directions to both ends of the assembly.

Figure 4:
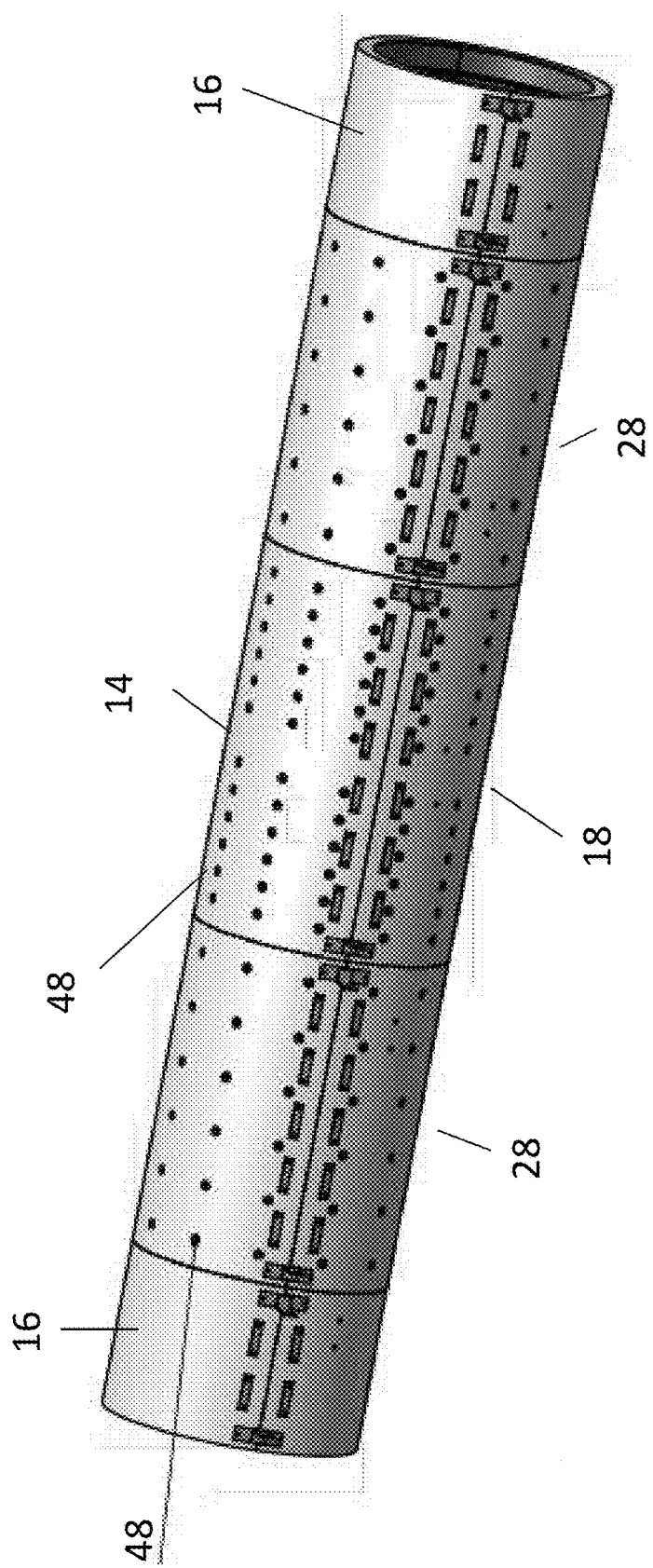
FIG. 4 is a perspective view of the heating element assembly.

Referring again to FIGS. 2-4, thermal processing chamber 12 includes central portion 18 and injection ports 48 can be disposed at a higher concentration in the heating zone in the central portion 18 of the heating element assembly and at a lower concentration in heating zones 28 located distally from the central portion 18 of the heating element assembly so as to advantageously proportion the cooling flow throughout the heating zones 14.

Figure 5A:
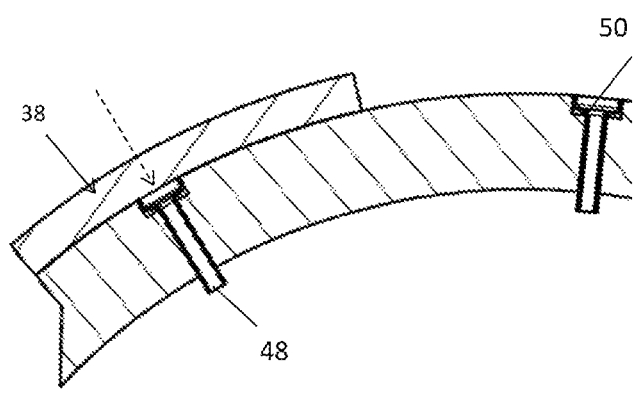
FIGS. 5A and 5B are partial cross-sectional view of the insulation layers with injection ports and injectors.
Figure 5B:
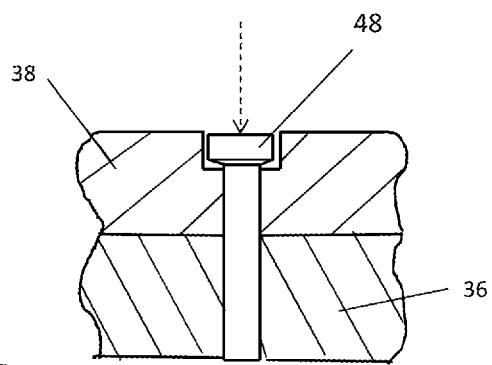

Referring to FIGS. 5A and 5B, the layer of insulating material 36 can be a dense inner refractory layer with a more porous outer refractory layer 38, the outer refractory layer being able to facilitate the flow of the temperature adjusting medium 34 and minimizing any heat loss and cold spots created by the injectors. For example, the dense inner refractory layer 36 could be made from moulded refractory fiber with a typical thickness of between about 12 and about 100 mm, for example about 32 mm and the more porous outer refractory layer 38 could be made of refractory ceramic fiber blanket with a typical thickness of between 6 and 75 mm, for example about 12 mm.

Injection ports 48 may either only extend through the dense inner refractory layer 36 (FIG. 5A) and not the more porous outer refractory layer 38 or penetrate both the inner refractory layer 36 and the outer refractory layer 38 (FIG. 5B). The cooling medium 34 can be forced through the layers as shown by the dashed arrow.

Figure 6:
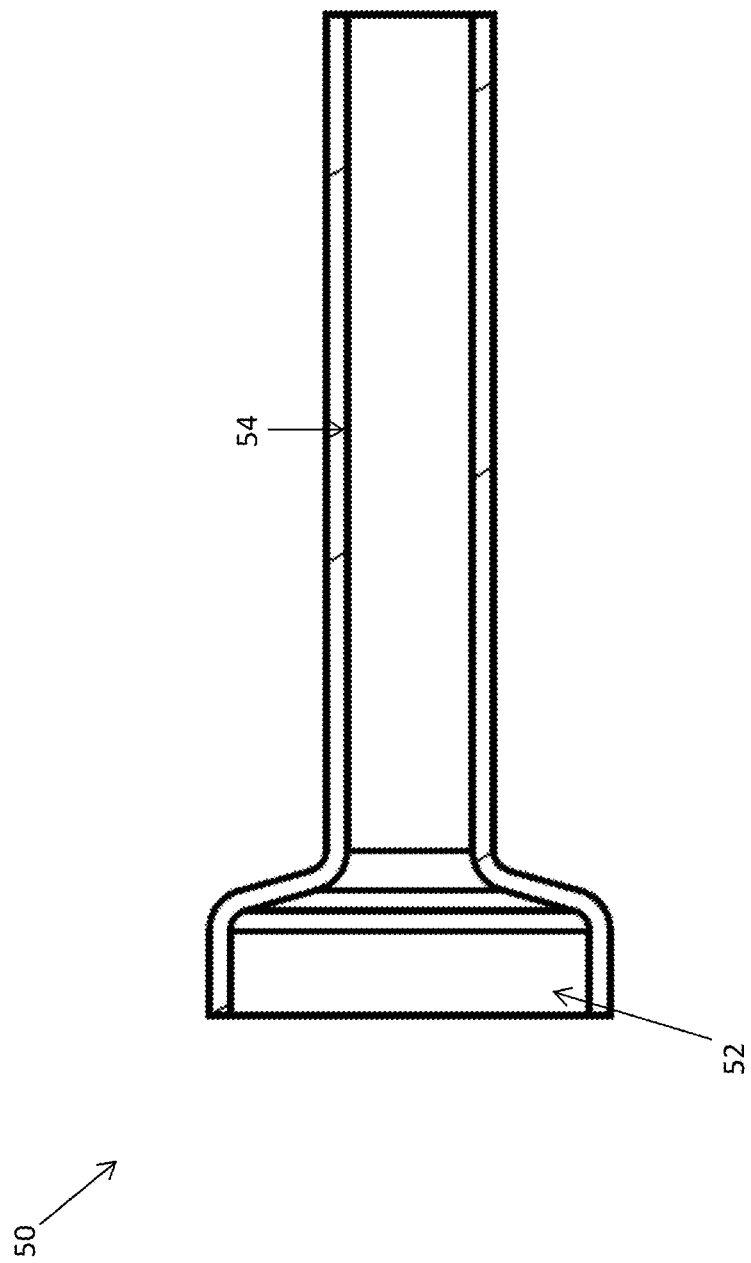
FIG. 6 is a cross sectional view of an injector of the thermal processing device.

The secondary shell 30 is used in conjunction with the outer refractory layer 38 and has holes therein that correspond to the locations of the ports. An injector 50 can be located in each of the plurality of injection ports 48. As shown in FIG. 6, each injector 50 includes an injector head 52 and a body 54.

Figure 7:
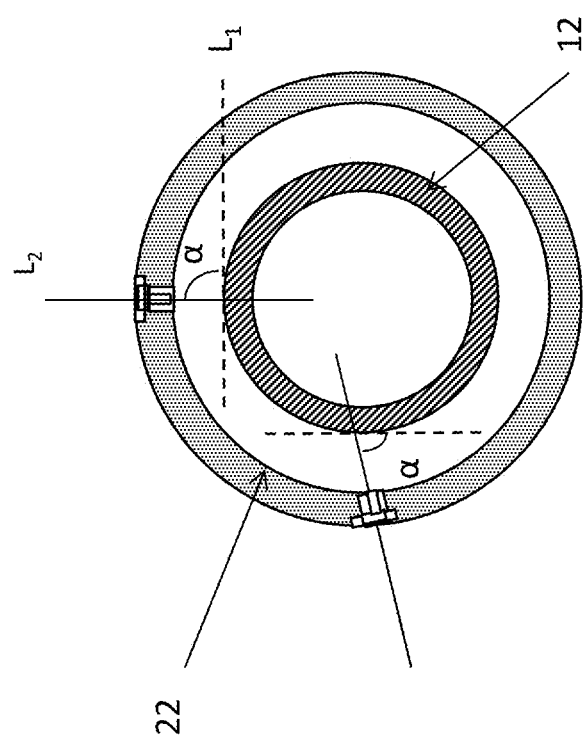
FIG. 7 is a cross-sectional view of the thermal processing chamber and injectors.

Referring to FIG. 7, an angle ($\alpha$) between an imaginary line (L1) tangent to the thermal processing chamber 12 and an axis of an injection port (L2) is typically between about 30°-90°. The angle ($\alpha$) could be altered in order to direct the opening of the injector away from the material being processed in the chamber which could further improve temperature uniformity.

The injectors can be made from a ceramic material with low conductivity and good thermal shock resistance. Injectors 50 may be substantially cylindrical having a diameter of between about 3 mm to about 10 mm, for example, having an outer diameter of about 6 mm and an inner diameter of about 5 mm. Injection ports 50 may also be non-cylindrical. The injector configuration minimizes the heat loss from the injector opening where is penetrates the heat emitting surface.

Figure 8B:
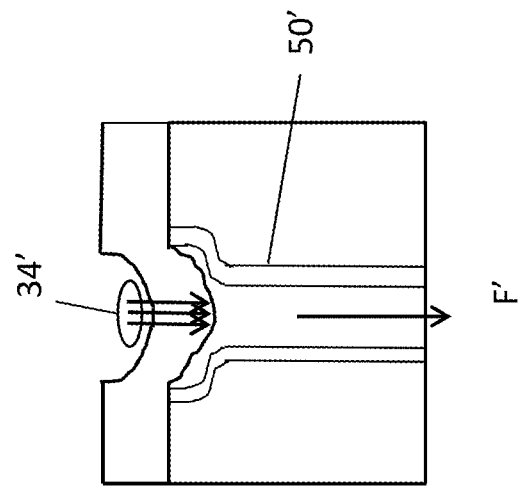
FIGS. 8A and 8B illustrate flow scenarios through an injector.
Figure 8A:
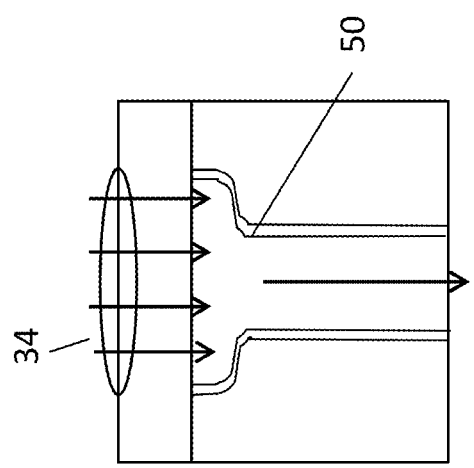

The diameters of the injectors are chosen in order to provide sufficient area for the cooling fluid medium 34 to flow through the porous insulation 36 without creating a very large pressure drop through insulation 36, see FIG. 8A. Accordingly, injectors 50 can have a headspace with a relatively large diameter and shallow depth as can be seen in FIG. 6. Further, this feature creates some back pressure at the point of impingement of the temperature adjusting medium flow which will help to maintain the desired spacing between the porous insulation inner surface and the injector. Referring to FIG. 8B, if the porous insulation is allowed to deform and collapse from the pressure differential created across its thickness it may reduce the surface area through which the temperature adjusting medium 34' is able to flow and therefore reduce the flow F' through the injector.

Figure 9:
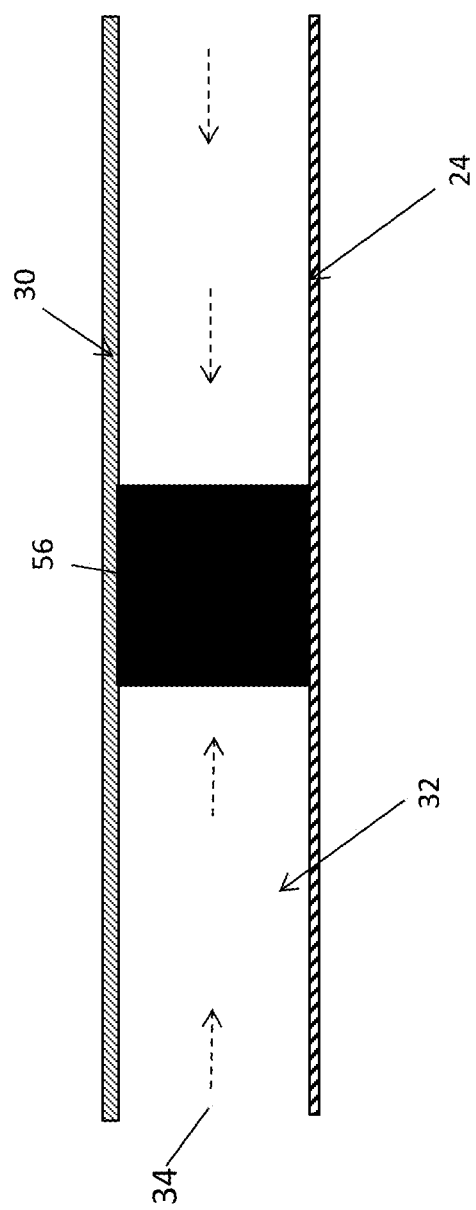
FIG. 9 is a cross sectional view of the inlet flow passage and baffles.

Referring to FIGS. 3 and 9, and as discussed supra, thermal processing chamber 12 includes the flow directing arrangement/barrier(s) 46 in the inlet flow 32 passage between the outer surface 24 of the heating element 20 and the secondary shell 30. It should be appreciated that although only one barrier is shown, a plurality of barriers 46 can be provided. Barrier(s) 46 can be a baffle 56 as shown in FIG. 9.

Figure 10A:
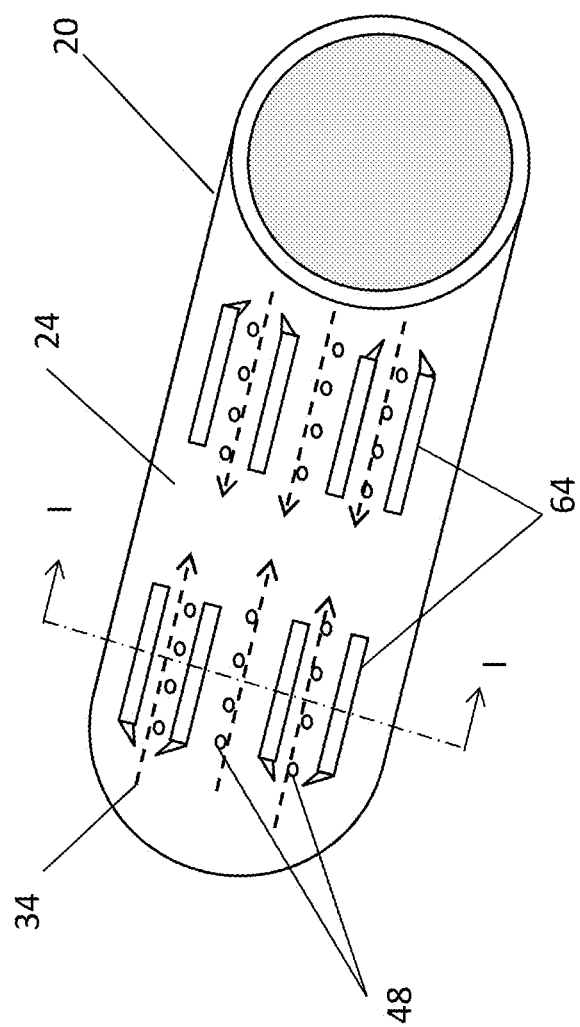
FIG. 10A is a perspective view of illustrating the baffles being axial fins, with FIG. 10B being a cross-section taken along Line I-I of FIG. 10A.
Figure 10B:
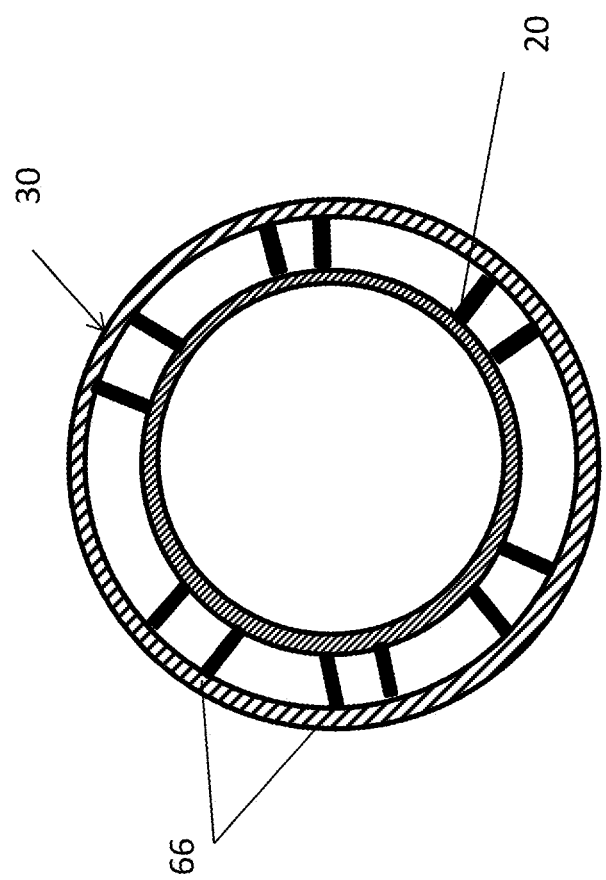

The flow directing arrangement can be used to interrupt the static convection flow and deflect the preferential direction of the flow of the temperature adjusting medium 34 and further to provide mechanical support in order to maintain the correct geometry between the heating element assembly and the secondary shell 30. Referring to FIGS. 10A and 10B, the flow directing arrangement can be axial fins 64 extending partially or completely along the length of the outer surface 24 of heating element assembly 20. A plurality of injection ports 48 can be distributed between the fins in the heating assembly such that the flow of medium 34 is directed over ports 48 and hence injectors 50.

Figure 11A:
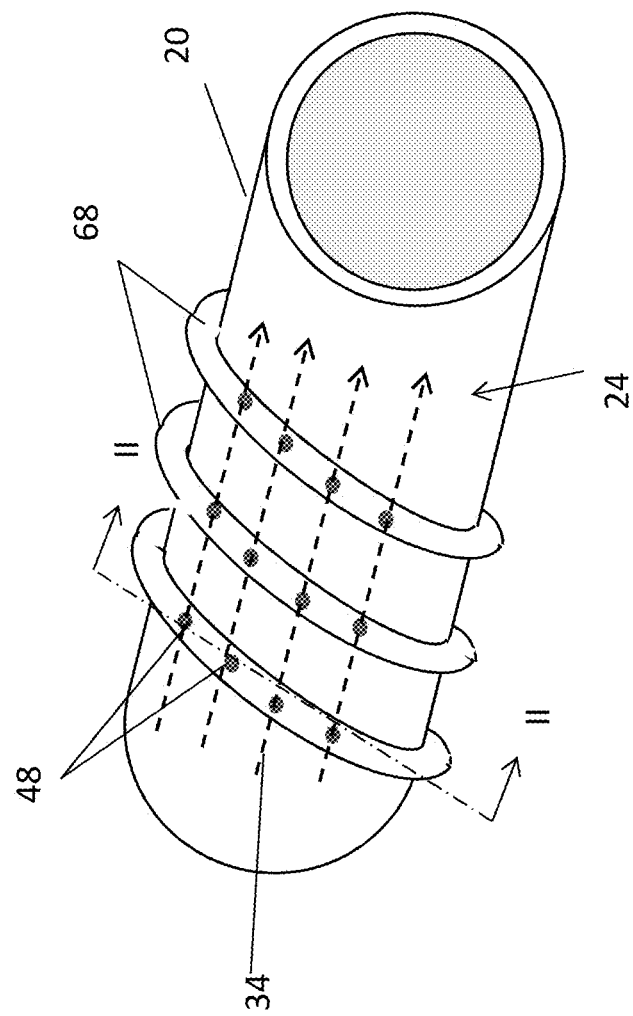
FIG. 11A is a perspective view of illustrating the baffles being radial fins, with FIG. 11B being a cross-section taken along Line I-I of FIG. 10A.
Figure 11B:
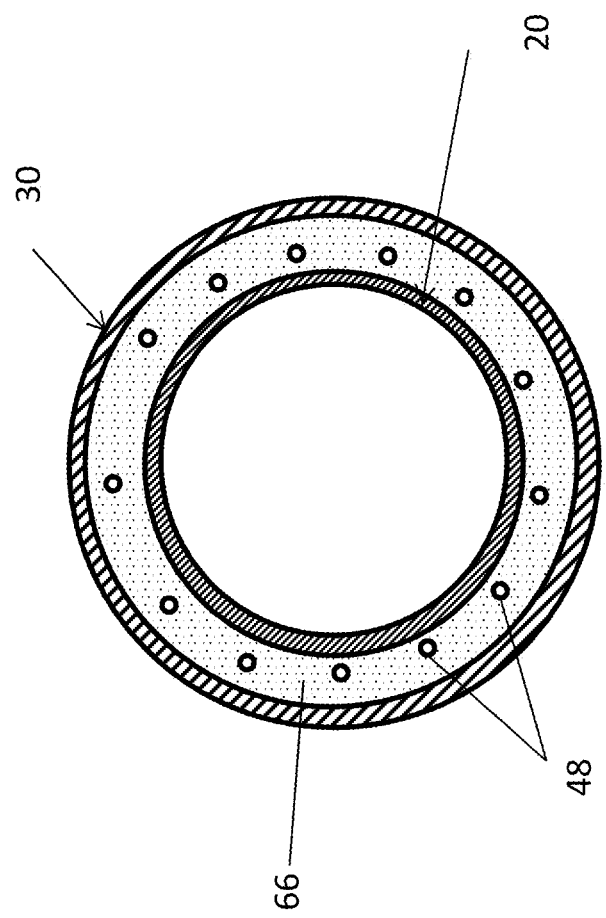

The flow directing arrangement can also include radial fins 68 extending about heating assembly 20 as shown in FIGS. 11A and 11B. The injection ports 48 and injectors 50 can be located in radial fins 66 to direct the flow of medium 34 as discussed supra.

Figure 12:
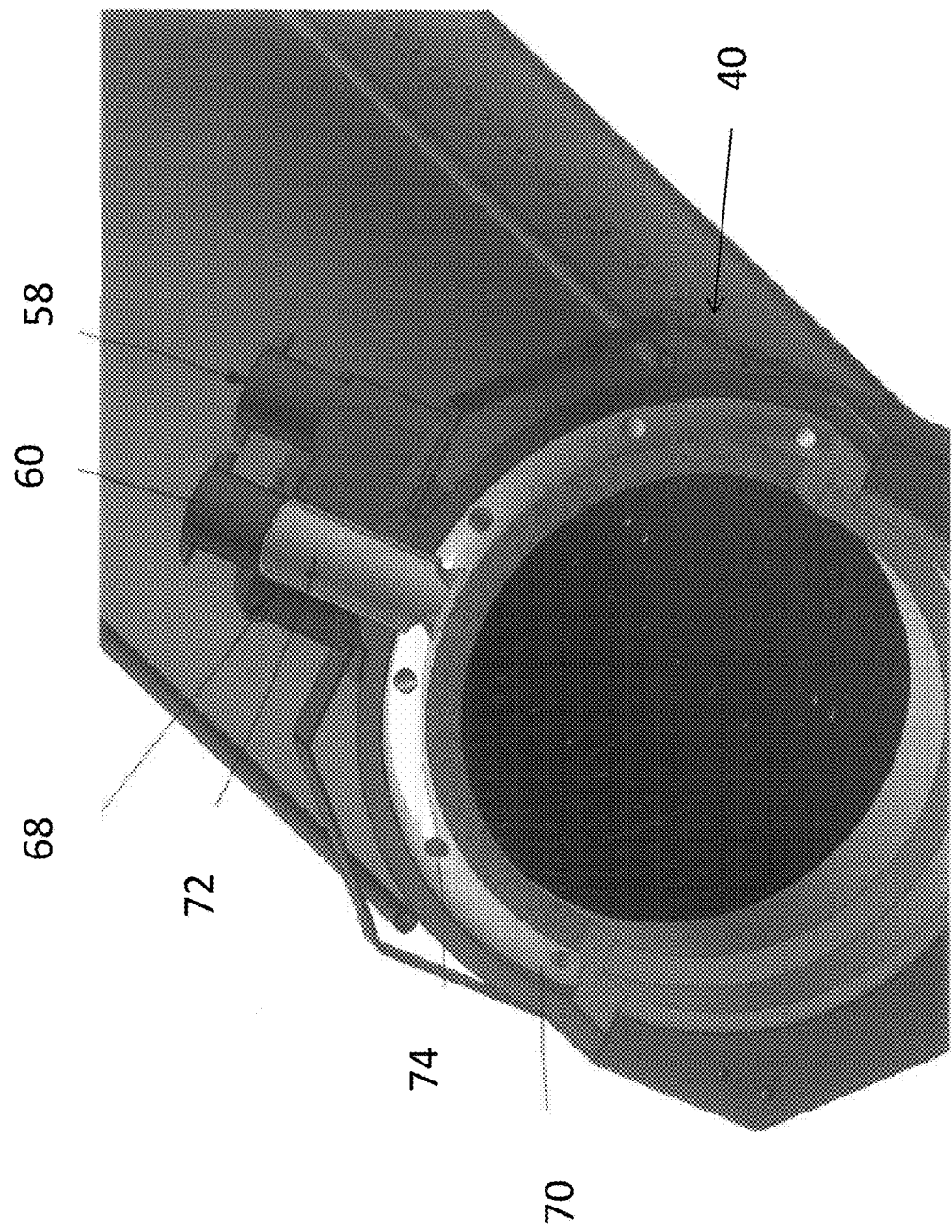
FIG. 12 is a partial cross-section of the vestibule assembly.
Figure 13:
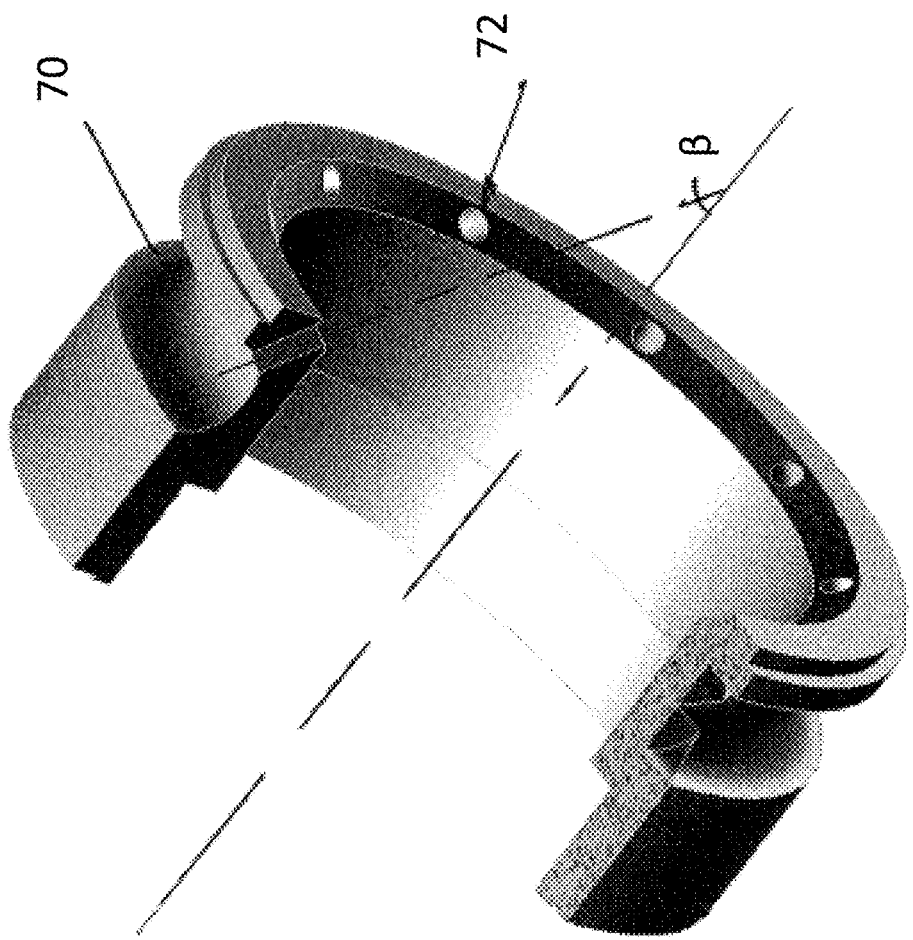
FIG. 13 is a partial perspective view of the annular channel of the vestibule assembly.

Referring to FIG. 12, the vestibule assemblies 40 at both ends of the thermal processing chamber include at least one temperature adjusting medium inlet 58 and at least one exhaust outlet 60 located in a housing 68. An annular exhaust channel 70 is connected to an exhaust duct 72. Exhaust channel 70 is an inner ported surface in proximity to the active heating area in which a series of exhaust ports 74 are distributed radially on the surface. As shown in FIG. 13, the surface is preferentially oriented at an angle $\beta$ relative to the central axis of the process chamber, wherein the angle ($\beta$) is about 45°, such that the surface is configured as a truncated cone having a greater surface area with which to contain larger diameter exhaust ports than if the surface was oriented at the 90 degree angle to the central axis of the process chamber. The exhaust ports 74 can have a diameter of about 9 mm to about 25 mm in diameter when configured as a cylindrical port. The exhaust ports may also be configured in a non-cylindrical shape as appropriate to achieve the optimal flow characteristics through the vestibule ported surface.

Referring again to FIG. 12, duct 72 communicates with exhaust outlet port 60 and is located within housing 68. The cooling medium fills the vestibule of housing and surrounds the duct 72 in a coaxial configuration. In other words, the inlet and outlet flow paths are preferentially connected to the thermal processing chamber in a coaxial configuration with the hot exhaust duct 72 contained within the temperature adjusting medium inlet 58. This arrangement minimizes any heat transfer from the hot exhaust pipe to the environment surrounding the thermal processing chamber, yielding positive effects on safety, thermal stability and maintenance of the system in which it is installed.

Figure 14:
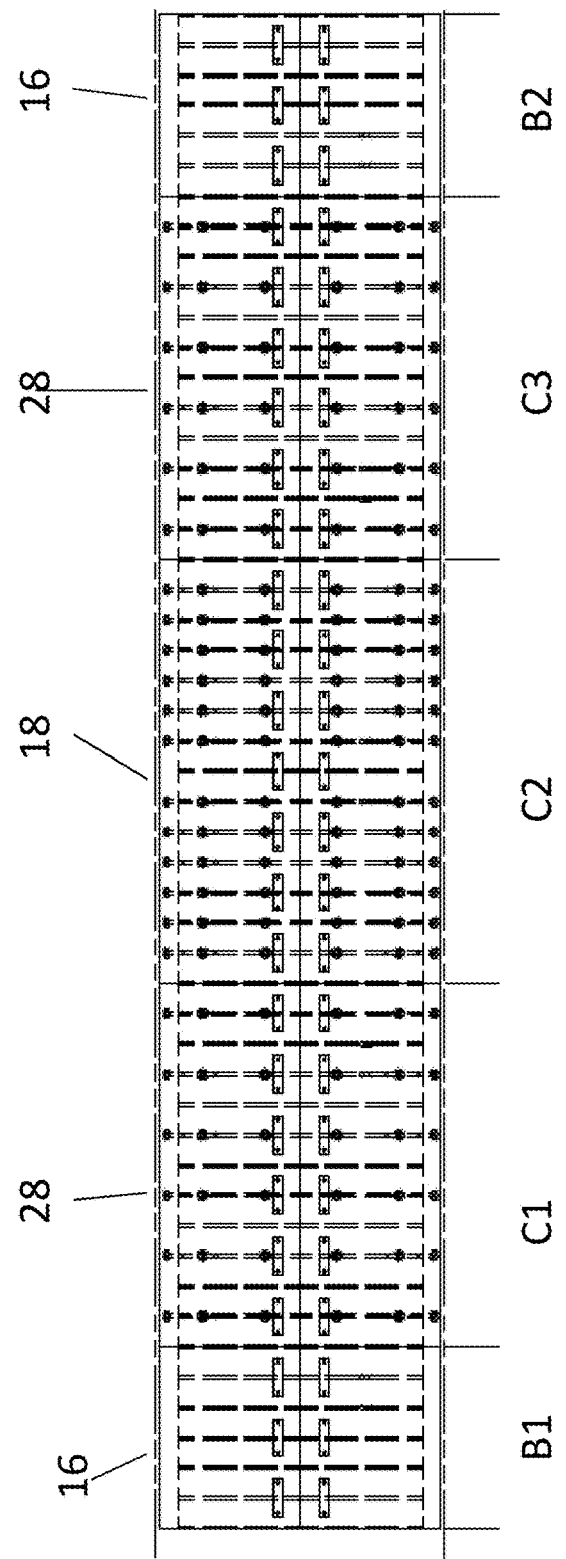
FIG. 14 illustrates the zones along the thermal processing chamber and as used in the plots shown in FIGS. 15-17.

The thermal process device can be any sort of multi-zone cooling process and specifically could be used for a horizontal thermal processing chamber with a fluidic cooling system. The overall configuration is reduced in complexity compared to other systems with complex piping systems, having a robust design where no mechanical adjustments are needed. The improvement in temperature uniformity can be demonstrated by comparing the temperature profile across the chamber. FIG. 14 shows the zones B1 and B2 relating to the buffer zones 16, C1 and C3 relating the heating zones 28 distal from the central portion 18 and C2 relating to the central portion 18 of the heating zone 14.

Figure 15:
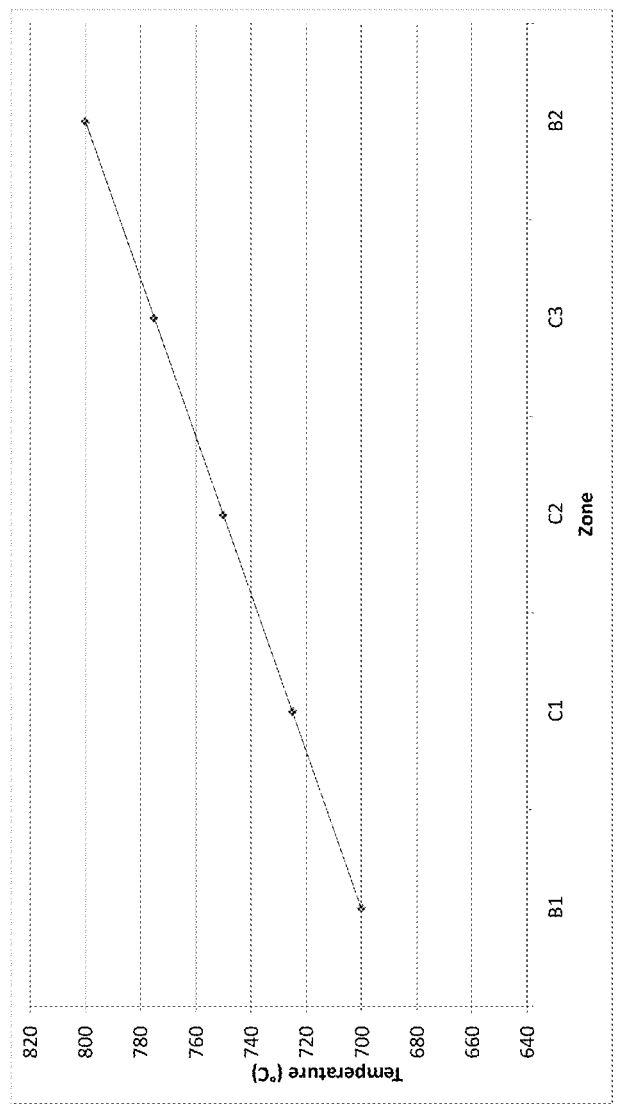
FIG. 15 is a plot of the temperature profile across the thermal process chamber when uni-directional cooling is employed.

In the case of uni-directional cooling flow the temperature profile across the length of the thermal process device can be seen in FIG. 15, showing an example of the temperature profile where the temperature adjusting medium is injected at B1 and extracted at B2.

As can be seen, the end where the temperature adjusting medium is injected cools the fastest, while the energy transferred at the exhaust end, cooling is much slower, therefore leaving a large sloping gradient across the load which takes substantial time to equalize at the end of the process cycle.

Figure 16:
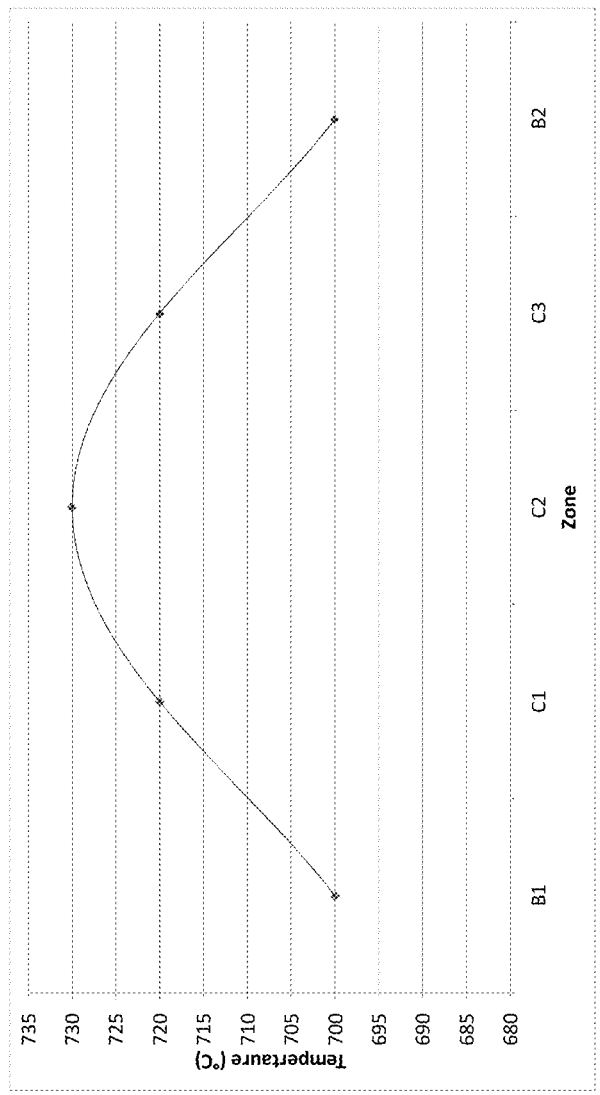
FIG. 16 is a plot of the temperature profile across the thermal process chamber when bi-directional cooling is employed.

FIG. 16 shows the case for a bi-directional cooling flow. In this case the temperature adjusting medium injection and extraction points alternate between B1 and B2 and it can be seen that although the temperature profile is more uniform and balanced from end to end, the central portion cools slower since the temperature adjusting medium is injected at the ends and therefore loses heat capacity as it travels towards the center, as well as transferring heat to the central portion, therefore will still take time to equalize at the end of the process cycle.

Figure 17:
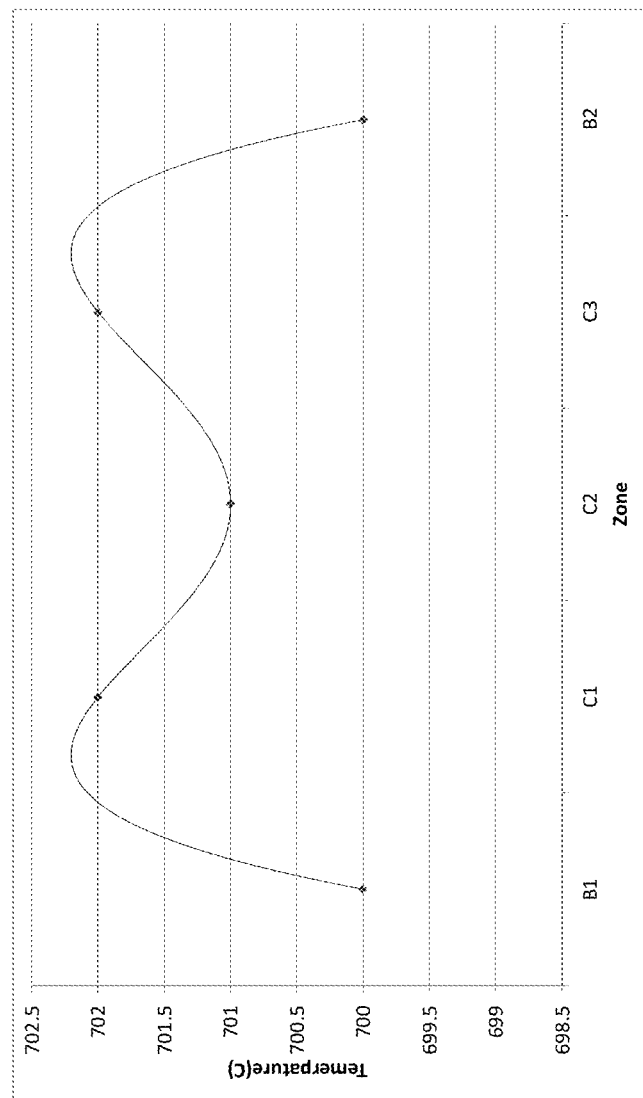
FIG. 17 is a plot of the temperature profile across the thermal processing chamber when the device of the present disclosure is employed, i.e. the injection point is at the center of the heating zone.

FIG. 17 shows the temperature profile from the thermal process device as described in the present disclosure. The present disclosure essentially means that the injection point is at the center of the heating zone. Consequently the temperature profile at the end of the process cycle is much more uniform. This therefore shortens the recovery time at the end of the process, therefore yielding a higher throughput.

In order to avoid damage to the secondary shell 30 from thermal expansion of the heating element assembly 20 it may be preferable to make further modifications to the thermal process device 10. Firstly, the material used for the outer surface of the heating element assembly 24, could be made from a stainless steel having a low coefficient of thermal expansion (Cte), for example a stainless steel having a Cte in the range of 11.0-11.5 µm/m-° K.

Figure 18:
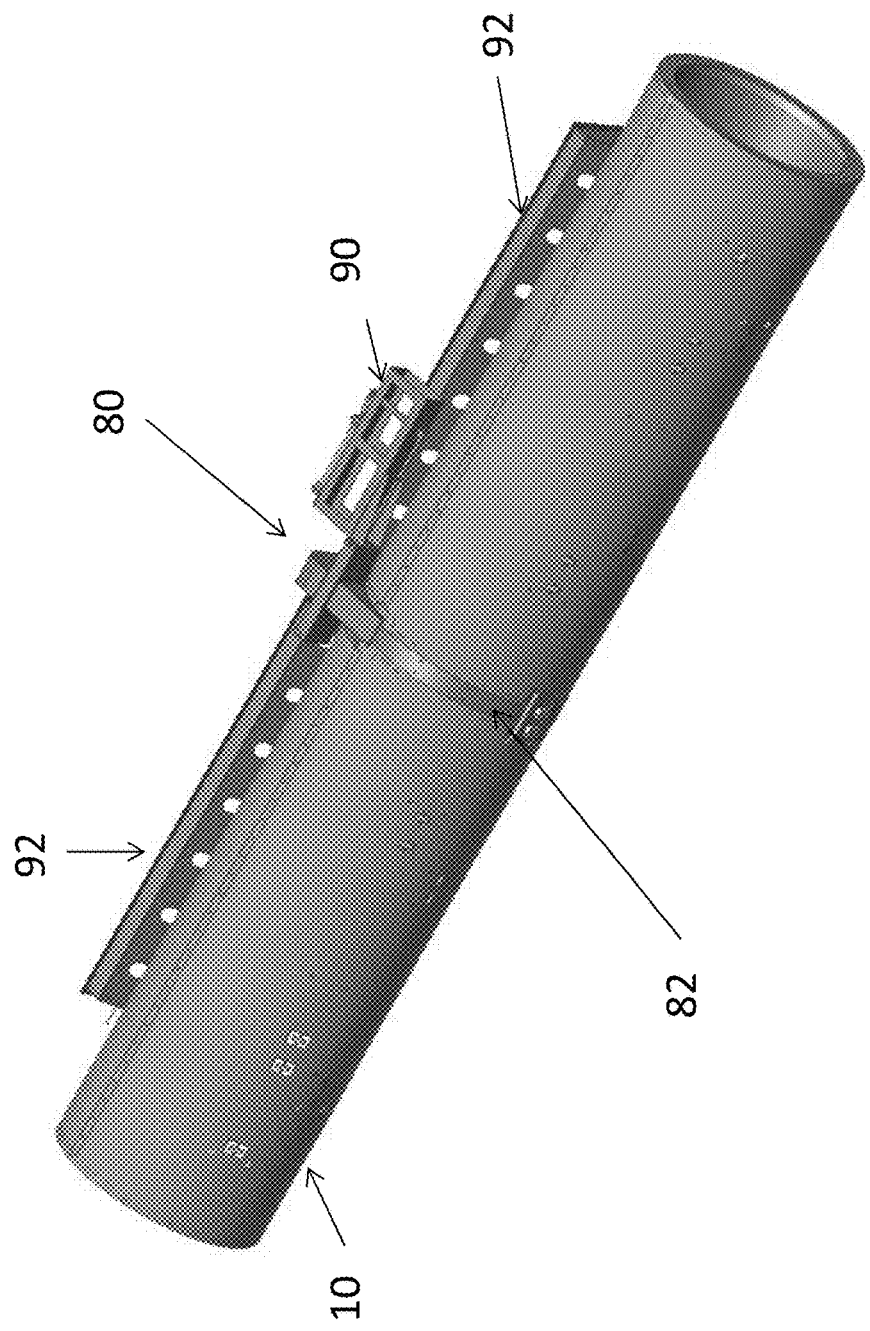
FIG. 18 is a perspective view of the thermal process device with an air collector sub-assembly according to the present disclosure
Figure 19:
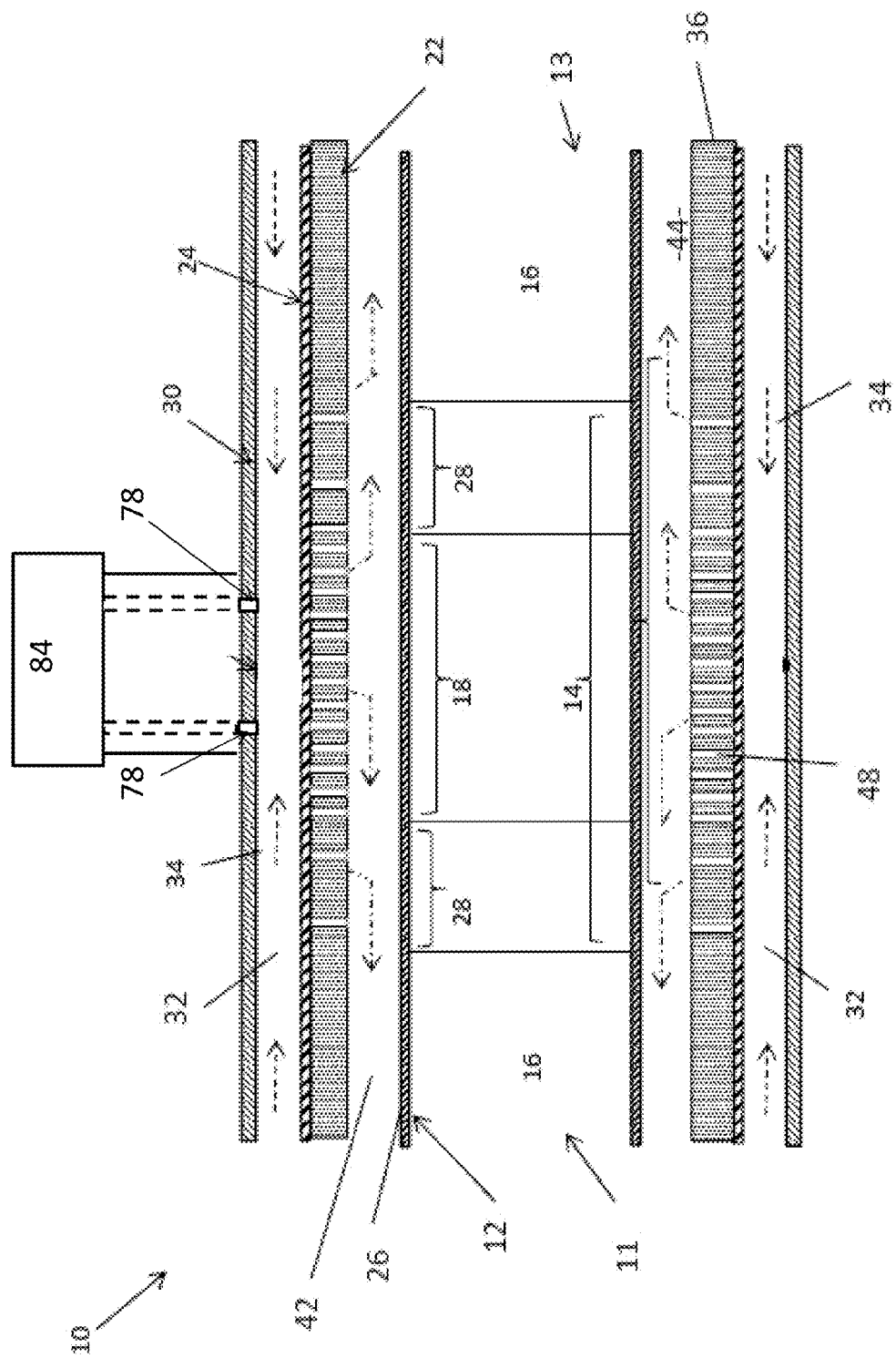
FIG. 19 is a partial cross-sectional view of the thermal process device of FIG. 1 illustrating the forced convection cooling ports of the air collector sub-assembly.

Referring to FIGS. 18-22, a further improvement to the design to reduce any damage that may occur as a consequence of thermal expansion is achieved by introducing a forced convection flow. As shown in FIG. 18, an air collector subassembly 80, which communicates with inlet flow passage 32 (FIG. 19) includes an exhaust ring 82 that is positioned about secondary shell 30 of thermal process device 10. As will be described further herein and as shown in FIG. 19, the air is exhausted from the device 10 via forced convention exhaust ports 78 in the exhaust ring 82 thereby allowing some air flow through inlet flow passage 32. The air will exit from ports 78 in front of the heat exchangers 84. This will reduce the temperature of the secondary shell 30 and outer surface of the heating element assembly 20.

Forced convection air can enter through inlet 58, for example at a flow of approximately 25-60 cubic feet per minute (cfm). The air flows in the flow passage 32 and exits through exhaust ports 78 of the exhaust ring 82 to the heat exchanger. This flow of air is low enough not to generate sufficient pressure to flow into the injection ports 48.

Figure 20:
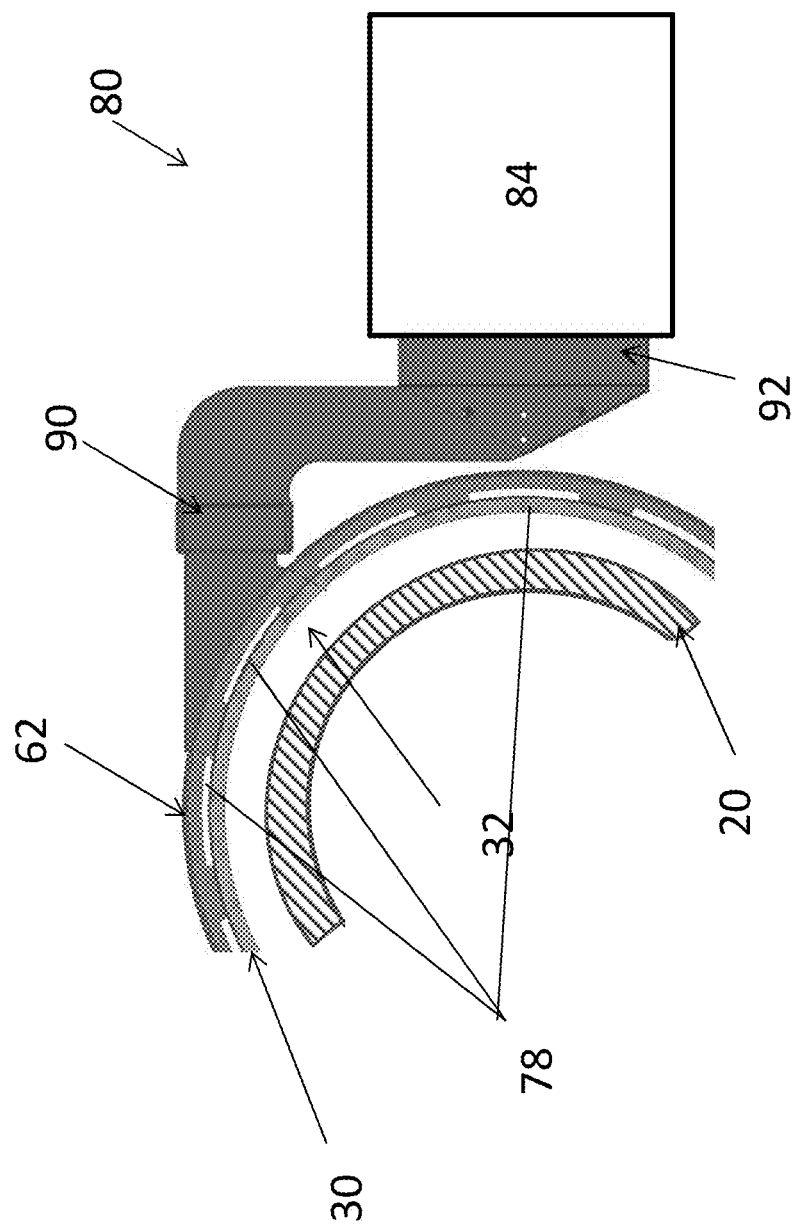
FIG. 20 is a cross-sectional view of the air collector sub-assembly.

Referring to FIG. 20, air collector sub-assembly 80 couples the flow passage 32 to the system exhaust heat exchangers 84 and provides means of adjusting the exhaust draw. Port(s) 78 are connected through a shutter valve 90 to a heat exchanger flow coupler 92. Coupler 92 communicates with the heat exchanger and provides means to adjust flow from exhaust ring 82.

Figure 21:
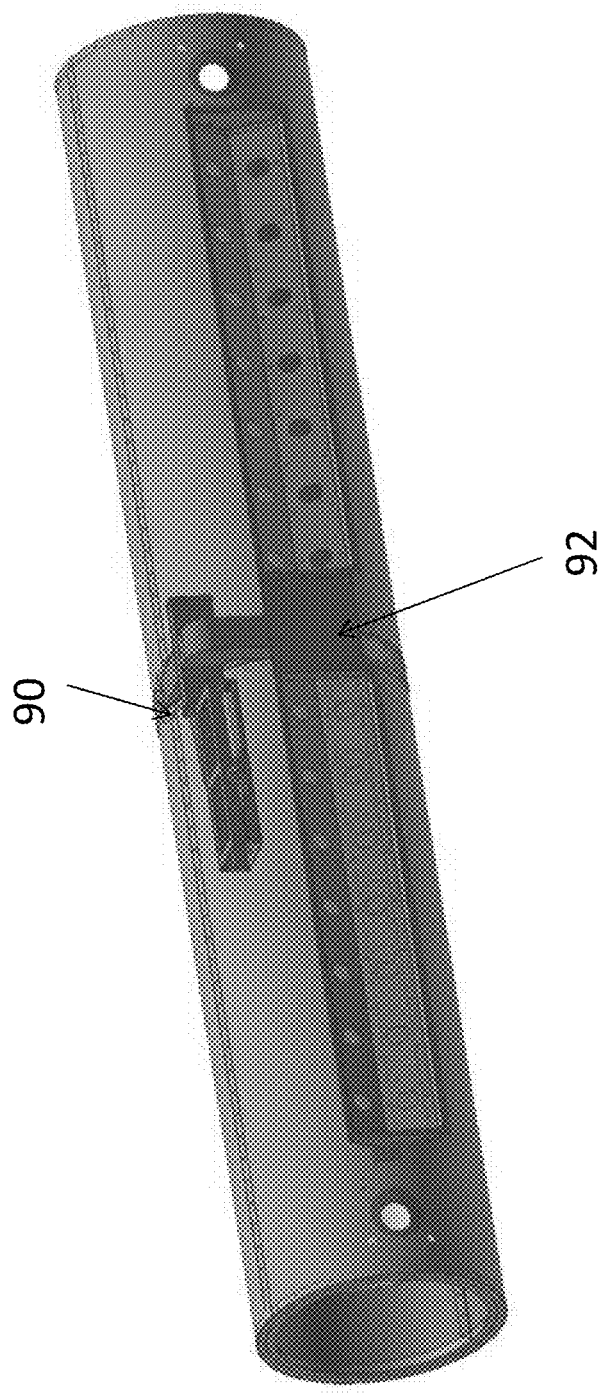
FIG. 21 is a perspective view of the thermal process device cover assemblies which cover the finned area of the system heat exchanger.

As shown in FIGS. 21 and 22, coupler 92 includes an adjustment damper 94 movably mounted thereon to slide back and forth to open and close air balance holes 96 to balance the amount air being pulled across the outside of the shell versus the amount of air being pulled from exhaust ring by opening/closing the balance holes. Thus, damper 94 moves back and forth axially along coupler.

The presence of the shutter valve 90 on the heating element assembly 20 facilities the ability to quickly cool the heating zones 14 if so desired. Under normal operation, the shutter value 90 is in the open position, by closing the shutter valve 90 the flow passage 32 becomes pressurized, at the same time the flow is adjusted or increases at inlet 58 and outlet 60 of FIG. 12, this will lead to the fast cooling of the heating zones 14 if desired. Thus, the balance of the air flow through and around the area outside the heating element assembly 20 is adjusted via four flow couplers 92 having dampers 94 that can be slid back and forth axially to control the amount of air that bypasses the flow passage 32 between the assembly and shell.

Although the present embodiments have been described in relation to particular aspects therefore, many other variations and modifications and other uses will become apparent to those skilled in the art. It is preferred therefore, that the present embodiments be not limited by the specific disclosure herein, but only by the appended claims.

What is claimed is:

1. A thermal process device for heat treating a product or plurality of products, the assembly comprising:
   a thermal processing chamber having opposed distal ends and a plurality of controllable heating zones, wherein the thermal processing chamber is a fluidic cooling system;
   at least one buffer zone disposed at each of the distal ends, the buffer zones and heating zones of the thermal processing chamber forming a heating element assembly, the heating element assembly having an inner and outer surface;
   a secondary shell disposed about the outer surface of the heating element assembly spaced to form a flow passage for a flow of a temperature adjusting medium along the heating element assembly, wherein the flow passage between the outer surface of the heating element assembly and the secondary shell forms an inlet flow passage;
   an annular space disposed between the inner surface of the heating element assembly and the outer surface of the thermal processing chamber, the annular space forming an exhaust flow passage for the flow of the temperature adjusting medium;
   at least one layer of insulating material located at the inner surface of the heating element assembly, the at least one layer of insulating material forming an innermost surface of the heating element assembly; and
   a flow directing arrangement configured to direct the flow of the temperature adjusting medium in the inlet flow passage to the plurality of controllable heating zones and the at least one buffer zone of the heating assembly to adjust the temperature in the plurality of controllable heating zones, wherein a majority of the flow of the temperature adjusting medium is delivered to a central portion of the heating temperature assembly, the central portion being part of the plurality of controllable heating zones and then outward toward at least one of the distal ends, wherein the flow directing arrangement includes at least one barrier disposed in the flow passage to divide the flow into at least two different directions to control the flow to desired heating zones of the heating element assembly, and a plurality of injection ports disposed in the at least one layer of the insulating material; wherein the thermal processing chamber includes the central portion, the plurality of injection ports being disposed at a higher concentration in the heating zones in the central portion of the heating element assembly and at a lower concentration in heating zones located distally from the central portion of the heating element assembly.

2. The thermal process device of claim 1, wherein the temperature adjusting medium flows in at least two different directions to control the flow to desired heating zones of the heating element assembly from the central zone to both distal ends.

3. The thermal process device of claim 1, further comprising a vestibule assembly disposed at each distal end, wherein each vestibule assembly forms part of the heating element assembly.

4. The thermal process device according to claim 1, wherein the barrier divides the flow passage into equal portions.

5. The thermal process device according to claim 1, wherein the at least one layer of insulating material has a dense inner refractory layer and a more porous outer refractory layer, the more porous outer refractory layer being arranged to facilitate the flow of the temperature adjusting medium flowing therethrough into an injector.

6. The thermal process device according to claim 5, wherein the injection ports only penetrate the dense inner refractory layer and not the more porous outer refractor layer.

7. The thermal process device according to claim 5, wherein the injection ports penetrate both the hard inner refractory layer and the more porous outer refractor layer.

8. The thermal process device according to claim 1, further comprising an injector disposed in each of the plurality of injection ports, the injector being substantially cylindrical.

9. The thermal process device according to claim 1, further comprising an injector disposed in each of the plurality of injection ports, the injector being substantially non-cylindrical.

10. The thermal process device according to claim 1, wherein the injector includes an injector head and a body, the injector head having a larger diameter than a diameter of the injector body.

11. The thermal process device according to claim 1, wherein an angle ($\alpha$) between an imaginary line tangent to the thermal processing chamber and an axis of the injector is between 30° and 90°.

12. The thermal process device according to claim 1, wherein the at least one barrier is included in the inlet flow passage between the outer surface of the heating element and the secondary shell.

13. The thermal process device according to claim 3, wherein each vestibule assembly includes at least one exhaust hole.

14. The thermal process device according to claim 13, wherein the at least one exhaust hole is in fluid communication with the exhaust flow passage.

15. The thermal process device according to claim 13, wherein each vestibule assembly includes a temperature adjusting medium injection connection, the at least one exhaust hole being arranged coaxially within the temperature adjusting medium injection connection.

16. The thermal process device according to claim 13, wherein each of the exhaust holes are orientated at an angle ($\beta$) with respect to a central axis of the vestibule assembly.

17. The thermal process device according to claim 16, wherein the angle ($\beta$) is of about 45°.

18. The thermal process device according to claim 13, wherein the at least one exhaust hole is cylindrical.

19. The thermal process device according to claim 13, wherein the at least one exhaust hole is non-cylindrical.

20. The thermal process device according to claim 1, further comprising an air collector sub-assembly arranged to generate an exhaust flow in the inlet flow passage, the air collector sub-assembly including an exhaust ring arranged to connect the inlet flow passage to at least one exhaust port of the exhaust ring.

21. The thermal process device according to claim 20, wherein the at least one exhaust port is connected through a shutter valve to a heat exchanger flow coupler, the shutter valve being arranged to move between an open position and a closed cooling position, wherein in the closed position the inlet flow passage becomes pressurized.

22. The thermal process device according to claim 21, wherein the heat exchange flow coupler including a movable flow damper arranged to adjust cooling air flow delivered to the heat exchanger.

* * * * *